US012163882B2

(12) United States Patent
Nie et al.

(10) Patent No.: US 12,163,882 B2
(45) Date of Patent: Dec. 10, 2024

(54) METHOD FOR SELECTION OF CALIBRATION SET AND VALIDATION SET BASED ON SPECTRAL SIMILARITY AND MODELING

(71) Applicant: SHANDONG UNIVERSITY, Shandong (CN)

(72) Inventors: Lei Nie, Jinan (CN); Yue Sun, Jinan (CN); Hengchang Zang, Jinan (CN); Yingzi Zeng, Jinan (CN); Xiaoyan Liu, Jinan (CN); Mei Su, Jinan (CN); Meng Yuan, Jinan (CN); Linlin Wang, Jinan (CN); Hong Jiang, Shandong (CN); Guangyi Chu, Jinan (CN)

(73) Assignee: SHANDONG UNIVERSITY, Jinan (CN)

(*) Notice: Subject to any disclaimer, the term of this patent is extended or adjusted under 35 U.S.C. 154(b) by 897 days.

(21) Appl. No.: 17/289,657

(22) PCT Filed: Oct. 14, 2020

(86) PCT No.: PCT/CN2020/120950
§ 371 (c)(1),
(2) Date: Apr. 28, 2021

(87) PCT Pub. No.: WO2021/073541
PCT Pub. Date: Apr. 22, 2021

(65) Prior Publication Data
US 2021/0404952 A1 Dec. 30, 2021

(30) Foreign Application Priority Data
Oct. 17, 2019 (CN) .......................... 201910986971.0

(51) Int. Cl.
*G01N 21/359* (2014.01)
*G06F 17/16* (2006.01)
*G06F 30/20* (2020.01)

(52) U.S. Cl.
CPC .......... *G01N 21/359* (2013.01); *G06F 17/16* (2013.01); *G06F 30/20* (2020.01); *G01N 2201/127* (2013.01)

(58) Field of Classification Search
CPC .......... G01N 21/359; G01N 2201/127; G01N 2201/129; G01N 21/274; G06F 17/16; G06F 30/20; G06F 17/18
See application file for complete search history.

(56) References Cited

U.S. PATENT DOCUMENTS

| | | | | |
|---|---|---|---|---|
| 5,446,681 A | * | 8/1995 | Gethner | ............... G01R 35/005 703/2 |
| 6,529,767 B1 | | 3/2003 | Woo et al. | |

(Continued)

FOREIGN PATENT DOCUMENTS

| | | |
|---|---|---|
| CN | 103411893 A | 11/2013 |
| CN | 105486663 A | 4/2016 |

(Continued)

OTHER PUBLICATIONS

Xiaomi Wang, et al., "Construction of the Calibration Set through Multivariate Analysis in Visible and Near-Infrared Prediction Model for Estimating Soil Organic Matter," Remote Sens. 2017, 9, 201 p. 1-18 (Year: 2017).*

(Continued)

*Primary Examiner* — Steven W Crabb
(74) *Attorney, Agent, or Firm* — Oliff PLC (57) ABSTRACT

A method for selection of a calibration set and a validation set based on spectral similarity and modeling. The method includes: performing NIR spectrometry on original samples (Continued)

to obtain a spectral matrix of the original samples; randomly selecting m samples as an independent test set; calculating spectral similarity between each of the samples in the independent test set and each of the remaining samples in the original samples respectively to obtain g samples having the highest similarity to be written into the validation set; and calculating spectral similarity between each of the samples in the validation set and each of the remaining samples in the original samples respectively to obtain n samples having the highest similarity to be written into the calibration set. Based on the validation set and the calibration set selected through the method, an obtained model can predict unknown samples more accurately.

18 Claims, 6 Drawing Sheets

(56) References Cited

U.S. PATENT DOCUMENTS

| | | | |
|---|---|---|---|
| 6,754,543 B1* | 6/2004 | Wold | G01N 21/359 700/52 |
| 2008/0034025 A1* | 2/2008 | Zubkov | G01D 18/00 708/422 |

FOREIGN PATENT DOCUMENTS

| | | |
|---|---|---|
| CN | 106770005 A | 5/2017 |
| CN | 107179293 A | 9/2017 |
| CN | 110687072 A | 1/2020 |
| IN | 109324014 A | 2/2019 |
| JP | WO2016/039000 A1 | 4/2017 |

OTHER PUBLICATIONS

Xia et al., "Non-destructive Determination of Sugar Content in Apple by Near Infrared Spectroscopy with Similarity Evaluation Combined with Local Regression Method," Journal of Instrumental Analysis, 2010, vol. 29, No. 12, pp. 1173-1177.

Apr. 29, 2020 Office Action issued in Chinese Patent Application No. 201910986971.0.

Jan. 14, 2021 International Search Report issued in International Patent Application No. PCT/CN2020/120950.

Jan. 14, 2021 Written Opinion of the International Searching Authority issued in International Patent Application No. PCT/CN2020/120950.

* cited by examiner

METHOD FOR SELECTION OF CALIBRATION SET AND VALIDATION SET BASED ON SPECTRAL SIMILARITY AND MODELING

BACKGROUND

Technical Field

The present invention belongs to the technical field of prediction for unknown objects, and particularly involves a method for selection of a calibration set and a validation set based on spectral similarity and modeling.

Related Art

The description in this section merely provides background information related to the present disclosure and does not necessarily constitute the prior art.

Near infrared (NIR) spectral analysis method is a non-destructive, non-polluting and good-reproductivity analytical technique quickly developing at present. With the development of chemometrics and computer technology, the technique has been widely applied to fields such as agricultural products, petrochemistry, pharmacy, environment, process control, clinics and biomedicine. One major characteristic of the method is that spectral information of a sample needs to be associated with corresponding reference value information (such as content and source) by chemometrics to establish a model, through which an unknown sample can be predicted, so as to achieve the purpose of analysis.

In order to establish an accurate model, it is necessary to divide an existing sample set, establish the model through a calibration set, and use a validation set to assist in evaluation of the effect of the model. Therefore, how to select the calibration set and the validation set has a great impact on the applicability and prediction ability of the model. The division of the sample set is crucial for the NIR spectral analysis. The selection of the calibration set and the validation set is a key step affecting the effect of the model. Samples in the calibration set need to have certain representativeness and contain as much sample information as possible, while the validation set is a feedback to reflect the quality of the model. If samples in the validation set cannot reflect the prediction ability of the model for unknown samples well, then the model performance may not be guaranteed. Therefore, the establishment of a new sample set dividing method with better model performance and stronger prediction ability is one of the key research directions for the current NIR spectral analysis.

According to the inventor's understanding, there are two classical and widely applied sample set dividing methods in the field of NIR spectral analysis, respectively a Kennard-Stone (KS) method and an SPXY method. The KS method selects representative samples into a calibration set by calculating the Euclidean distance between samples, so that the calibration set contains more sample information, but this method may also select abnormal samples into the calibration set, and there is a lack of certain pertinence in predicting unknown samples. The SPXY method takes reference value variables (Y) into account on the basis of the KS method, and ensures that they have the same weight in respective spaces, thereby effectively covering a multi-dimensional vector space. However, it is hard to determine whether these two methods have good prediction for unknown samples.

SUMMARY

In order to overcome the defects in the above prior art, the present invention provides a method for selection of a calibration set and a validation set based on spectral similarity and modeling, and the method has the better prediction performance to unknown samples.

To achieve the foregoing objective, one or more embodiments of the present invention provide the following technical solutions:

A method for selection of a calibration set and a validation set based on spectral similarity includes the following steps:

performing NIR spectrometry on original samples to obtain a spectral matrix of the original samples;

further, measuring a plurality of reference values for the original samples to obtain a reference value matrix of the original samples;

further, after the spectral matrix and the reference value matrix of the original samples are obtained, also performing abnormal value detection on the spectral matrix of the original samples to remove abnormal spectra, and removing corresponding reference values in the reference value matrix of the original samples;

randomly selecting m samples as an independent test set to simulate unknown samples;

calculating spectral similarity between each of the samples in the independent test set and each of the remaining samples in the original samples respectively to obtain g samples having the highest similarity to be written into the validation set; and calculating spectral similarity between each of the samples in the validation set and each of the remaining samples in the original samples respectively to obtain n samples having the highest similarity to be written into the calibration set.

Further, the spectral similarity between the samples is calculated by adopting a Euclidean distance.

Further, the number of the original samples after removal of the abnormal values is set to be N, and a relation of m, g and n meets: $g \leq n \leq (N-m)$.

Further, modeling is performed respectively when n has different values, and the value of n is optimized based on model performance to obtain an optimized model parameter value.

One or more embodiments provide a modeling method based on a method for selection of a calibration set and a validation set, wherein a reference value matrix corresponding to the calibration set is obtained, and each reference value in the reference value matrix is subjected to its affinity modeling with a spectral matrix respectively.

Further, the method further includes:

optimizing model parameters based on the validation set;

optimizing samples constituting the calibration set based on the validation set; and evaluating model performance based on an independent test set.

Further, the method further includes comprehensively evaluating the model performance based on the calibration set, the validation set and the independent test set.

The foregoing one or more technical solutions have the following beneficial effects:

According to the calibration set and validation set dividing method of the present invention, starting from validation data (e.g., the independent test set, which is regarded as unknown samples to test the model performance after a model is established) used to test the model performance, samples with spectra similar to the independent test set are selected to enter the validation set based on the independent test set and the spectral similarity, the prediction ability to the unknown samples is indirectly reflected by the prediction effect of the validation set; and then, based on the validation set, samples with spectra similar to the validation set are selected to enter the calibration set, so that it is ensured that the established model aims at the unknown samples, and compared with the current commonly used methods, it can be exactly proved that for the unknown samples, the modeling performance of the proposed method is better and the prediction ability is stronger.

Selection of the calibration set and the validation set further relates to selection of the number of the samples, and the number of the samples in the calibration set is optimized in the present invention, so that selecting few samples can achieve the better prediction effect.

BRIEF DESCRIPTION OF THE DRAWINGS

The accompanying drawings constituting a part of the present invention are used to provide a further understanding of the present invention. The exemplary embodiments of the present invention and descriptions thereof are used to explain the present invention, and do not constitute an improper limitation of the present invention.

DETAILED DESCRIPTION

It should be noted that, the following detailed descriptions are all exemplary, and are intended to provide further descriptions of the present invention. Unless otherwise specified, all technical and scientific terms used herein have the same meanings as those usually understood by a person of ordinary skill in the art to which the present invention belongs.

It should be noted that the terms used herein are merely used for describing specific implementations, and are not intended to limit exemplary implementations of the present invention. As used herein, the singular form is intended to include the plural form, unless the context clearly indicates otherwise. In addition, it should be further understood that terms "include" and/or "comprise" used in this specification indicate that there are features, steps, operations, devices, components, and/or combinations thereof.

The embodiments in the present invention and features in the embodiments may be mutually combined in case that no conflict occurs.

Figure 1:
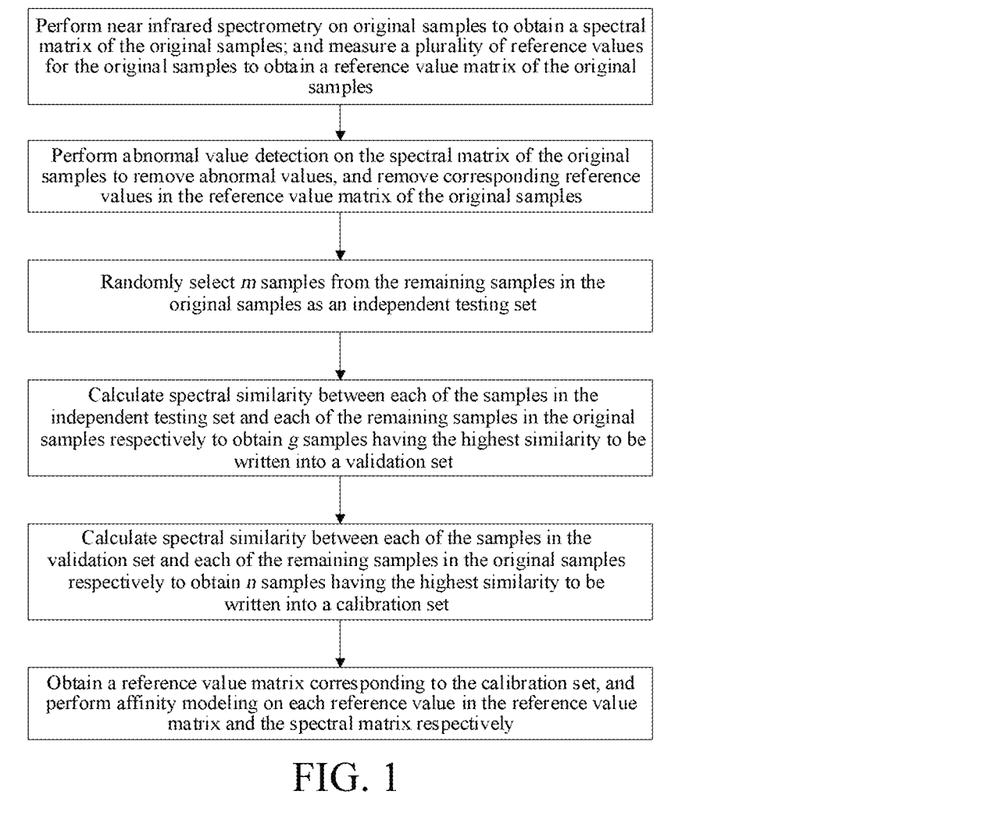
FIG. 1 is a flow chart of a method for selection of a calibration set and a validation set and a modeling method involved in one or more embodiments of the present invention.

A preferred embodiment of the present invention discloses a method for selection of a calibration set and a validation set for NIR quantitative modeling. Taking disclosed corn data as an example, the number of measured samples is 80 in total, including sample duplication. As shown in FIG. 1, the method includes the following steps:

Step 1: original samples are subjected to NIR spectrometry to obtain a spectral matrix X of the original samples.

Step 2: reference values of the original samples are measured through a reference method to obtain a reference value matrix Y of the original samples.

In the present embodiment, four quality index components are selected for the reference values of corn: water, oil, protein and starch so as to construct the reference value matrix Y, where each column represents reference values of a quality index.

Step 3: the spectral matrix X of the original samples is subjected to abnormal value detection, abnormal spectra are removed, and corresponding reference values in the reference value matrix Y are removed.

Figure 2:
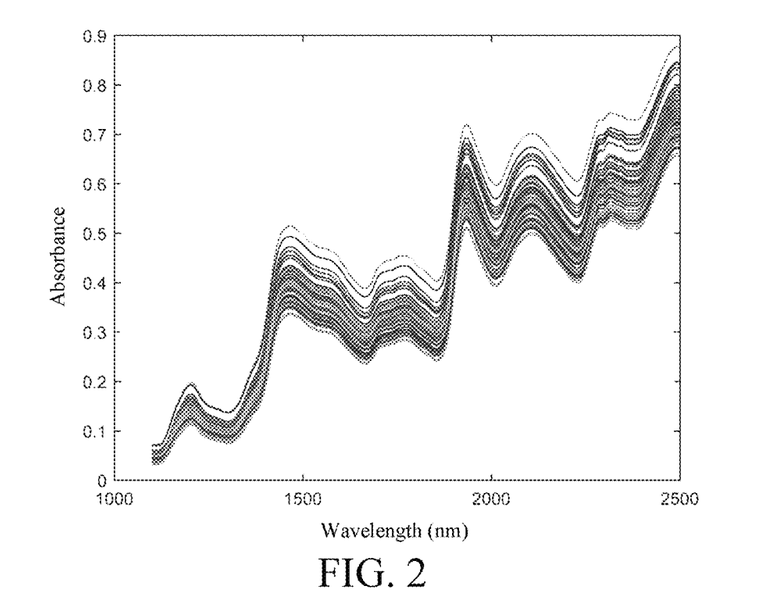
FIG. 2 shows original NIR spectra of all samples in Embodiment 1.
Figure 3:
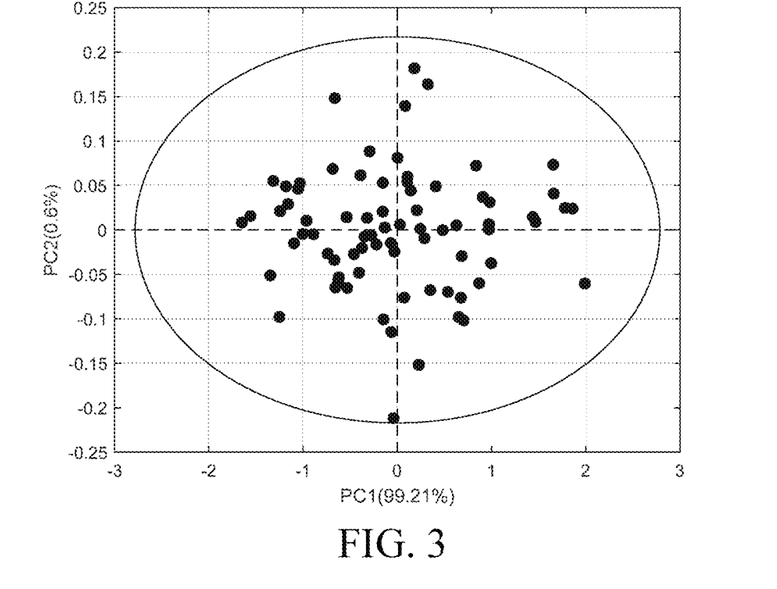
FIG. 3 is a projection diagram of main components after removal of abnormal samples in Embodiment 1.

An original map of the samples is as shown in FIG. 2. Abnormal samples are removed firstly, 3 abnormal samples are detected through a Hotelling $T^2$ method, and 77 samples are left after removal. A principal component projection diagram of NIR spectra of the samples after removal of the abnormal values is as shown in FIG. 3. As shown in FIG. 3, no abnormal sample exists in the remaining samples through Hotelling $T^2$ test (in an elliptical ring).

Step 4: m samples are randomly selected to constitute an independent test set to simulate unknown samples needing to be predicted.

In the original spectral matrix X with the abnormal values removed, a certain number of samples are selected to constitute the independent test set to simulate the unknown samples needing to be predicted, a corresponding spectral matrix is recorded as $X_t$, and its corresponding reference value is recorded as $Y_t$, where samples in $X_t$ and samples in $Y_t$ correspond to each other one to one. The number of the samples in the independent test set should be determined as actually required, generally should not exceed the number of samples in the calibration set and is equivalent to the number of samples in the validation set. A reference value range generally should be contained in a reference value range of the samples in the calibration set.

In the present embodiment, 10 (m=10) samples are randomly selected as the independent test set. Generally, if only the calibration set and the validation set are divided, the ratio of the calibration set to the validation set is usually 2:1, 3:1 or 4:1. If the independent test set is considered, the ratio of the calibration set to the validation set to the independent test set may be 4:1:1, 6:1:1 or 8:1:1.

Step 5: spectral similarity between each of the samples in the independent test set and each of the remaining samples in the original samples is respectively calculated to obtain a plurality of samples having the highest spectral similarity to the sample, duplication-elimination treatment is performed, then the plurality of samples are written into the validation set, and a corresponding spectral matrix $X_v$ and reference value matrix $Y_v$ are obtained.

Since the spectral information is easy to obtain and fast to detect, and only the spectral information of the samples in the independent test set is assumed to have been measured, the validation set samples can be selected according to the principle of spectral similarity, so that the prediction effect of the validation set indirectly reflects the prediction ability to the unknown test samples. A specific method is as follows: take each sample in the independent test set as a reference sample, a Euclidean distance $D_i$ between the sample and a spectrum $X_i$ of each of the remaining samples is calculated respectively, and the distances are sorted. The closer the distance is, the more similar the spectrum of the sample in the independent test set is to that of a certain sample in the remaining samples. Each sample in the independent test set is calculated as above in sequence, and then each sample in the independent test set may find the most similar g samples from the remaining samples. According to the actual number of samples and modeling requirements, the most similar g samples may be selected for each sample in the independent test set to form the validation set, and then redundant duplicate samples are removed, that is, the final validation set is obtained. The corresponding spectrum set is recorded as $X_v$, and the corresponding reference value matrix is recorded as $Y_v$, where g≥1 and g is a positive integer.

In the present embodiment, the remaining 67 samples are divided, the Euclidean distance $D_i$ between each sample in the spectral matrix $X_t$ corresponding to the independent test set and a spectral matrix $X_i$ of the remaining samples is calculated and sorted, 1 most similar sample (i.e., g=1) is selected for each sample in the independent test set $X_t$, redundant duplicate samples are removed, and a final validation set $X_v$ is constituted, where the number of samples in $X_v$ is about 8-10, and a corresponding reference value matrix is recorded as $Y_v$. The samples which are most similar to the independent test set are selected as the samples in the validation set, and the samples may simulate the samples in the independent test set to feed back a model effect, thereby achieving the better prediction effect.

A calculating formula for the Euclidean distance between each sample in the independent test set $X_t$ and the remaining samples $X_i$ is: $D_i = \mathrm{sqrt}(\Sigma(X_i - X_{t,j})^2)$, where sqrt represents square root, $X_{t,j}$ represents that each sample in the independent set is an observation unit, and a sample having the smallest Euclidean distance to the remaining samples $X_i$ is selected from the remaining samples $X_i$ as the sample which is most similar to $X_{t,j}$.

Step 6: spectral similarity between the remaining samples in the original samples and each sample in $X_v$ is respectively calculated to obtain a plurality of samples having the highest similarity to each sample (represented by $X_{v,i}$) in $X_v$, duplication-elimination treatment is performed, then the plurality of samples are written into the calibration set, and a corresponding spectral matrix $X_c$ and reference value matrix $Y_c$ are obtained.

After the samples in the validation set are obtained, the samples in the calibration set are selected similar thereto. Taking each sample in the validation set $X_v$ as a reference sample, the Euclidean distance $D_k$ between each sample in the validation set $X_v$ and a spectrum $X_k$ of each remaining sample is calculated respectively and sorted, each sample in the validation set $X_v$ is subjected to the above calculation in sequence, then the most similar n samples are selected for each sample in the validation set as the samples in the calibration set, and redundant duplicate samples are removed, so that a calibration set $X_c$ is selected.

In the present embodiment, the remaining samples are samples that may be selected by the calibration set, the number of the samples in the calibration set is determined by optimization of the number n of the most similar samples selected for each sample in the validation set, the number of the samples in $X_c$ is about 20 (or 18)~67 minus the number (i.e., 57-59) of the samples in $X_v$, and the corresponding reference value matrix is recorded as $Y_c$.

A calculating formula for the Euclidean distance between each sample in the validation set $X_v$ and the remaining samples $X_k$ is: $D_k = \mathrm{sqrt}(\Sigma(X_k - X_{v,i})^2)$, where, $X_{v,i}$ represents that each sample in the validation set is an observation unit, and n samples nearest to the sample are selected from the remaining samples to be used as the samples in the calibration set.

The samples selected in the calibration set according to the method are similar to those of the validation set and also indirectly similar to those of the independent test set, and therefore a calibration model for the unknown samples is established in a more targeted manner. A maximum value of n is the number adopted when all the remaining samples are selected into the calibration set, and a minimum value of n should be 2 times the number of the samples in the validation set. As n is different, the number of the samples in the calibration set selected for each of the samples in the validation set is different, and it is not necessary that the larger the number of the samples in the calibration set, the better the modeling effect. Abnormal samples or duplicate samples or sample information having the poor similarity to the samples in the validation set may be contained, and modeling may encounter a certain interference. If the number of the samples in the calibration set is too small, contained sample information is relatively little, and a distribution space of the unknown samples to be measured may not be covered, so the magnitude of n needs to be optimized, namely the number of the samples in the calibration set needs to be optimized. In the case that different n values are adopted, modeling is performed respectively, the magnitude of the adopted n values is optimized through an obtained RMSEV value and $R_v$ value of the validation set, the smaller the RMSEV value, the larger the $R_v$ value, and it proves that the modeling effect is optimal. The n value at the moment is selected as the optimized number of the most samples in the calibration set selected for the samples in the validation set, and at the moment, the spectral matrix corresponding to the selected calibration set is recorded as $X_c$, and the corresponding reference value matrix is recorded as $Y_c$.

Based on the validation set and calibration set dividing method provided by the above embodiment, another embodiment of the present invention further provides a model establishing and evaluating method, specifically including:

steps 1-6: a validation set and a calibration set are obtained by referring to the previous embodiment, and a spectral matrix and a reference value matrix corresponding to the validation set and the calibration set are obtained.

Step 7: modeling is performed according to the calibration set: each column of reference values in the reference value matrix is correlated to the spectral matrix respectively for modeling so as to obtain a corresponding calibration model.

Taking a water content parameter as an example, according to a division result, calibration set samples $X_c$ and a water content reference value matrix $Y_c$ are correlated through a partial least squares (PLS) method so as to establish a relation model between $Y_c$ and $X_c$ as follows:

$$Y_c = X_c B_{pls} \quad (1).$$

A model parameter is obtained according to formula (1), that is a regression coefficient $B_{pls}$.

Preferably, in step 7, the number of latent variables (model parameters to be solved in the model) in the modeling method is determined based on a minimum RMSEV value of the validation set $X_v$. Modeling is performed under the optimized number of the latent variables of the model.

Step 8: the model is optimized based on the validation set. Specifically, the validation set is predicted by a calibration model, a fitted value of a reference value is obtained, and model parameters are adjusted and optimized based on the fitted value and an actual value.

$$Y_v^f = X_v B_{pls} \quad (2).$$

Step 9: model performance is evaluated based on the independent test set. Specifically, the independent test set is predicted by the optimized model, a fitted value of a reference value is obtained, a root-mean-square error of prediction (RMSEP) and a correlation coefficient ($R_p$) are obtained based on the fitted value and an actual value, and the model performance is evaluated.

Step 10: the model performance is jointly evaluated according to the above parameters.

Since the independent test set contains a certain number of randomly selected samples, there is a certain contingency, and in order to objectively evaluate the performance of various dividing methods, the same number of samples are selected and 10 tests are repeated in parallel to calculate average values of the above indexes.

In practical application, in order to better compare the effects of the methods in the present embodiment, compared with models established based on other sample set selection methods (such as KS and SPXY), the RMSEP and the $R_p$ of predicted values can be calculated based on the same independent test set, so as to objectively evaluate the performance of the model.

Those skilled in the art can understand that before modeling, preprocessing steps of the calibration set, the validation set and the independent test set may be also included. Here, specific preprocessing methods are not limited. In the following specific embodiments, preprocessing is not adopted, and the original spectral matrix is used to model directly. If preprocessing methods are adopted, the preprocessing methods for the calibration set, the validation set and the independent test set need to be kept consistent.

Embodiment 1

Results of models established for four components of corn data in the present embodiment are shown in Table 1. Lv is a potential factor number, $N_c$ is the number of samples in a calibration set, and $N_v$ is the number of samples in a validation set.

TABLE 1

| | List of prediction results of components of corn | | | | | | | | | |
|---|---|---|---|---|---|---|---|---|---|---|
| Components | $R_c$ | RMSEC | $R_v$ | RMSEV | $R_p$ | RMSEP | RPD | Lv | $N_c$ | $N_v$ |
| Water | 0.9994 | 0.0121 | 0.9993 | 0.0146 | 0.9984 | 0.0207 | 28.1 | 9.5 | 42.6 | 9.1 |
| Oil | 0.9605 | 0.0449 | 0.9578 | 0.0577 | 0.9387 | 0.0603 | 3.0 | 9.3 | 45.5 | 9.1 |
| Protein | 0.9818 | 0.0901 | 0.9750 | 0.1030 | 0.9639 | 0.1226 | 5.1 | 9 | 44.7 | 8.9 |
| Starch | 0.9734 | 0.1830 | 0.9589 | 0.1893 | 0.9586 | 0.2773 | 4.4 | 9.5 | 46.1 | 9 |

Those skilled in the art can understand that as an alternative solution, the model evaluation method in the above steps 8-9 may also adopt a comprehensive evaluation manner, including:

step 8: then spectral data of the samples in the calibration set, the validation set and the independent test set are predicted by the calibration model, and fitted values of the sample sets are worked out as follows:

$$Y_c^f = X_c B_{pls} \quad (3);$$

$$Y_v^f = X_v B_{pls} \quad (2); \text{ and}$$

$$Y_t^f = X_t B_{pls} \quad (4).$$

Step 9: then a root-mean-square error of calibration (RMSEC) and a correlation coefficient ($R_c$) are calculated according to a fitted value $Y_c^f$ of the calibration set; a root-mean-square error of validation (RMSEV) and a correlation coefficient ($R_v$) of the validation set are calculated according to a fitted value $Y_v^f$ of the validation set; and finally a root-mean-square error of prediction (RMSEP) and a correlation coefficient ($R_p$) of the independent test set are calculated according to a fitted value $Y_t^f$ of the independent test set.

It can be seen from Table 1 that the smaller the values of RMSEC, RMSEV and RMSEP, the better, and the larger $R_c$, $R_v$ and $R_p$, the better. All the components of corn have a good modeling effect, the correlation coefficient $R_c$ of the calibration set reaches 0.95 or above, which indicates good model performance and a good fitting effect, and only about 40 samples are selected as the calibration set. The correlation coefficient $R_v$ of the validation set reaches 0.95 or above, which indicates good prediction ability of the models to the samples in the validation set. As for a randomly-selected independent test set, except oil, other components all have the $R_p$ value of 0.95 or above and the small RMSEP value, and the $R_p$ value of the independent test set is close to the $R_v$ value of the validation set, so that a method of selecting samples similar to the independent test set as the samples in the validation set to indirectly reflect prediction ability to unknown samples is desirable. In addition, the RPD values of all the components are greater than 3.0, which indicates good prediction ability of the models. The present invention may be used to select the sample sets and has a good effect.

Figure 4:
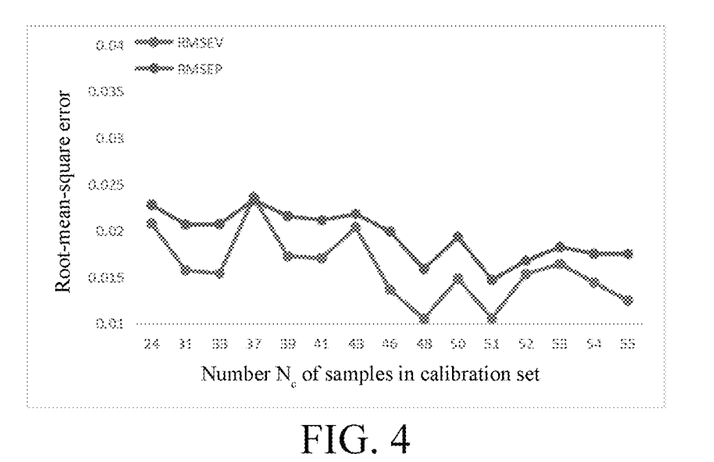
FIG. 4 is a diagram of variation rules of an RMSEV of a validation set and an RMSEP of an independent test set in the prediction of moisture in Embodiment 1.
Figure 5:
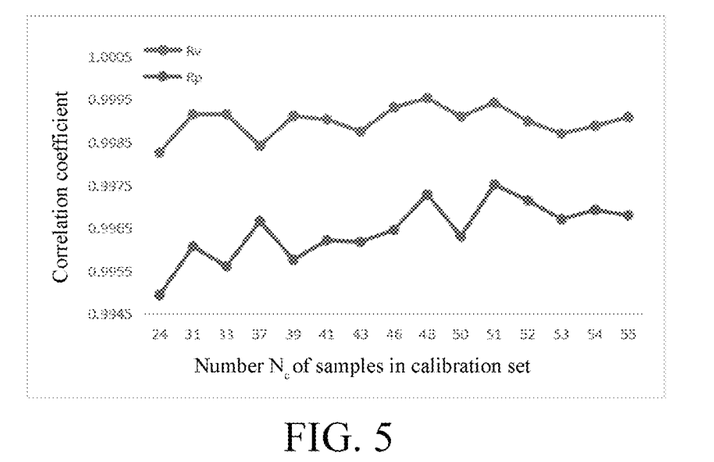
FIG. 5 is a diagram of variation rules of a correlation coefficient $R_v$ of the validation set and a correlation coefficient $R_p$ of the independent test set in the prediction of moisture in embodiment 1.

In order to determine whether the evaluation effect of the validation set selected through spectral similarity on model performance is close to that of the independent test set on the models, variation rules of root-mean-square errors and corresponding correlation coefficients of a validation set $X_v$ and an independent test set $X_t$ in the process of optimizing the number of the samples in the calibration set are compared, and results are shown in FIG. 4 and FIG. 5.

It can be seen from FIG. 4 that the root-mean-square error of validation (RMSEV) of the validation set and the root-mean-square error of prediction (RMSEP) of the independent test set have the basically consistent variation trend. When RMSEV reaches a minimum value, the RMSEP value is relatively small. In FIG. 5, the correlation coefficients $R_v$ and $R_p$ also have the consistent overall variation trend, so that selecting samples similar to the unknown samples through the spectral similarity method as the validation set to indirectly reflect the prediction effects of the models is feasible. Optimizing the calibration set based on the validation set reflects, to a certain extent, that prediction performance of the calibration set to the independent test set is optimized. Because the samples in the validation set and the samples in the independent test set have very similar spectra and the calibration set also selects the samples similar to the validation set, the unknown samples (i.e., the independent test set) are predicted in a more strongly targeted manner.

In order to evaluate the performance effects of the method proposed by the present invention, comparison to commonly used methods, namely a Kennard-Stone (KS) method and an SPXY method, will be made. The number of samples in a validation set is the same as the number in the present method, remaining samples are used as a calibration set, and the same independent test set is selected to compare modeling performance and prediction ability of the different methods. Relevant results are shown in Table 2.

TABLE 2

Comparison of prediction ability of models established by various data set dividing methods (averagely repeated for 10 times)

| Dividing methods | Water | | Oil | | Protein | | Starch | |
| --- | --- | --- | --- | --- | --- | --- | --- | --- |
| | $R_p$ | RMSEP | $R_p$ | RMSEP | $R_p$ | RMSEP | $R_p$ | RMSEP |
| KS | 0.99819 | 0.02106 | 0.92573 | 0.06813 | 0.96167 | 0.12470 | 0.94737 | 0.30275 |
| SPXY | 0.99826 | 0.01980 | 0.92772 | 0.06591 | 0.92099 | 0.17348 | 0.95439 | 0.28691 |
| Present method | 0.99844 | 0.02065 | 0.93866 | 0.06032 | 0.96388 | 0.12261 | 0.95864 | 0.27732 |

It can be seen from comparison in Table 2 that for prediction of the independent test set in the present method, although the RMSEP value of water is slightly higher than that of the SPXY method, the value of the correlation coefficient $R_p$ is the highest, which is better than the other two methods; for other components, the prediction ability is higher and the prediction error is smaller especially for oil which has a poor modeling effect itself. By analysis in combination with Table 1, only about 40 samples are used as the calibration set in the present method, while all remaining samples (about 57) except the validation set and the independent test set are adopted as the calibration set in the KS method and the SPXY method, and by contrast, the number of the samples in the calibration set of the present method is smaller, and the effects of calibration models is better.

The ranges of reference values of all components in the calibration set, the validation set and the independent test set divided in various methods are listed in Table 3. The ranges are average values of results of 10 tests.

TABLE 3

Ranges of reference values of data sets

| | | | KS method | | SPXY method | | Present method | |
| --- | --- | --- | --- | --- | --- | --- | --- | --- |
| | | Independent test set | Calibration set | Validation set | Calibration set | Validation set | Calibration set | Validation set |
| Water | Minimum value | 9.6689 | 9.4381 | 9.7024 | 9.4502 | 9.4502 | 9.4472 | 9.6856 |
| | Maximum value | 10.745 | 10.957 | 10.796 | 10.975 | 10.423 | 10.970 | 10.798 |
| Oil | Minimum value | 3.2432 | 3.1154 | 3.2756 | 3.1105 | 3.1105 | 3.1647 | 3.2031 |
| | Maximum value | 3.7554 | 3.8245 | 3.7766 | 3.8245 | 3.7358 | 3.8187 | 3.7983 |
| Protein | Minimum value | 8.0205 | 7.7086 | 8.103 | 7.7001 | 7.7001 | 7.7103 | 7.9873 |
| | Maximum value | 9.4331 | 9.696 | 9.3963 | 9.696 | 9.1433 | 9.6943 | 9.4329 |

TABLE 3-continued

| | | | Ranges of reference values of data sets | | | | |
|---|---|---|---|---|---|---|---|
| | | | KS method | | SPXY method | | Present method | |
| | | Independent test set | Calibration set | Validation set | Calibration set | Validation set | Calibration set | Validation set |
| Starch | Minimum value | 63.079 | 62.884 | 63.421 | 62.884 | 62.884 | 62.904 | 63.423 |
| | Maximum value | 65.816 | 66.171 | 65.714 | 66.177 | 65.629 | 66.055 | 65.514 |

It can be seen from Table 3 that the ranges of the reference values of four components of the samples in the calibration sets of the three dividing methods can all include the ranges of the reference values of the samples in the validation set and the independent test set. Theoretically, the range of the calibration set>the range of the validation set>the range of the independent test set. Generally, the range of the calibration set shall be greater than that of the validation set, and if not, the range of the samples in the calibration set may be further expanded to meet the above relation. The samples in the independent test set may be considered as the unknown samples, and corresponding $Y_t$ is not known in advance.

Embodiment 2

Figure 6:
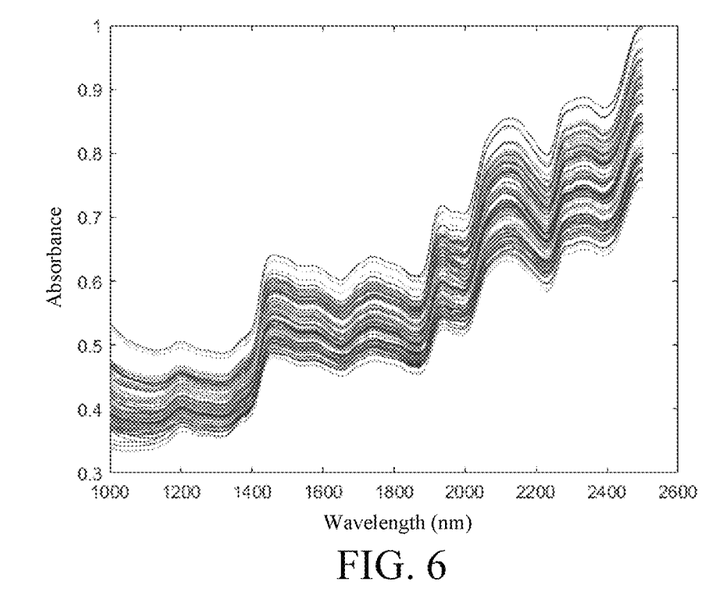
FIG. 6 shows original NIR spectra of all samples in Embodiment 2.
Figure 7:
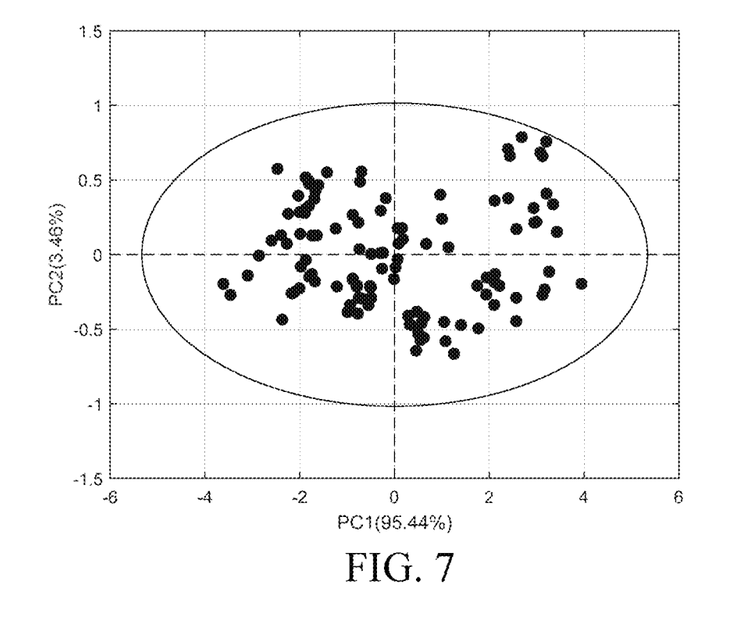
FIG. 7 is a projection diagram of principal components after removal of abnormal samples in Embodiment 2.

Taking the medicinal material radix salviae miltiorrhizae as an example, 120 samples are measured in total, including sample duplication. X is an NIR spectral matrix of the samples and is measured via a Fourier transform NIR spectrometer (Antaris II, ThermoFisher, USA). Y is a matrix of contents of four quality index components, respectively tanshinone IIA (TS IIA), cryptotanshinone (CTS), tanshinone I (TS I), and salvianolic acid B (SAB), and original spectra of the samples are shown in FIG. 6. The components are used as detection objects to evaluate new dividing methods, the content of tanshinone IIA is taken as an example in the method described below, and the same steps are adopted for the other components. Abnormal samples are removed firstly, 3 abnormal samples are detected through a Hotelling $T^2$ method, and 117 samples are left after removal. A diagram of principal component analysis (PCA) after removal of the abnormal values is as shown in FIG. 7. Fifteen samples are randomly selected as an independent test set $X_t$.

The remaining 102 samples are divided, where 1 most similar sample is selected for each sample in the independent test set $X_t$, redundant duplicate samples are removed, and a final validation set $X_v$ is constituted. The number of samples in $X_v$ is about 10-15, the remaining samples are selectable for a calibration set, the number of the samples in the calibration set is determined by optimizing the number n of the most similar samples selected for each sample in the validation set, and the number of the samples in $X_c$ is 10-87 (or 92).

According to dividing results, correlation models of X and Y are established respectively by adopting partial least squares (PLS) method, and model performance is jointly evaluated through a root-mean-square error of calibration (RMSEC) of the calibration set, a root-mean-square error of validation (RMSEV) of the validation set, a root-mean-square error of prediction (RMSEP) of the independent test set and corresponding correlation coefficients, namely the correlation coefficient ($R_c$) of the calibration set, the correlation coefficient ($R_v$) of the validation set and the correlation coefficient ($R_p$) of an independent test set. Since the independent test set contains a certain number of randomly selected samples, there is a certain contingency. In order to objectively evaluate the dividing methods of various data sets, 10 tests are repeated in parallel, and the same number of samples are randomly selected as the independent test set to calculate average values of the above indexes for comparison. Relevant results are shown in Table 4.

TABLE 4

| List of prediction results of components of medicinal material radix *salviae miltiorrhizae* | | | | | | | | | | |
|---|---|---|---|---|---|---|---|---|---|---|
| Components | $R_c$ | RMSEC | $R_v$ | RMSEV | $R_p$ | RMSEP | RPD | Lv | $N_c$ | $N_v$ |
| TS IIA | 0.9912 | 0.0071 | 0.9872 | 0.0088 | 0.9781 | 0.0140 | 6.8 | 10 | 53.8 | 13.8 |
| CTS | 0.9807 | 0.0121 | 0.9710 | 0.0168 | 0.9634 | 0.0229 | 3.9 | 10 | 65.3 | 13.9 |
| TS I | 0.9837 | 0.0032 | 0.9823 | 0.0036 | 0.9764 | 0.0048 | 5.8 | 9.3 | 53.3 | 14.2 |
| SAB | 0.9769 | 0.3775 | 0.9749 | 0.3742 | 0.9675 | 0.5370 | 5.0 | 9.7 | 60.4 | 13.5 |

It can be seen from Table 4 that all the components of the medicinal material radix salviae miltiorrhizae have good modeling effects. The correlation coefficients of the calibration set, the validation set and the independent test set reach 0.95 or above, and the root-mean-square errors are small. The evaluation indexes of the validation set are better than those of the independent test set, and this is because the samples selected for the calibration set are the samples similar to the validation set and are optimized through the samples in the validation set. The RPD values of all the components are greater than 3.0, which indicates good prediction ability of the models. Moreover, the number of the samples in the calibration set is optimized in the present invention, and the number of the samples in the calibration set is reduced to about 50 or 60 (see Table 4), which lowers the actual workload.

Figure 8:
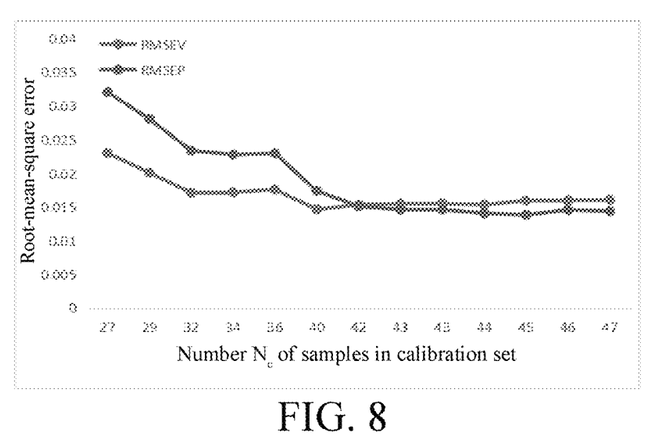
FIG. 8 is a diagram of variation rules of an RMSEV of a validation set and an RMSEP of an independent test set in the prediction of TS IIA in Embodiment 2.
Figure 9:
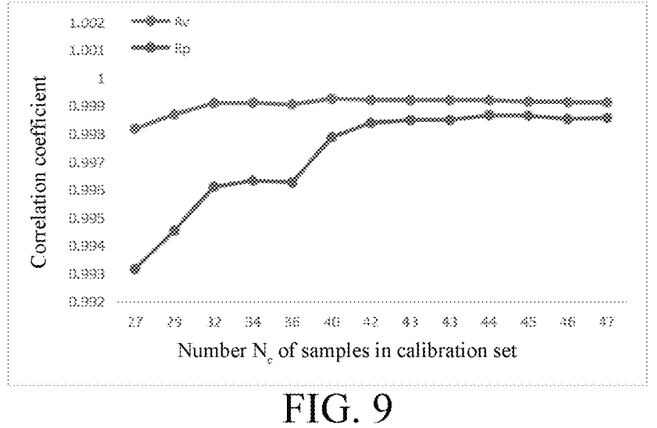
FIG. 9 is a diagram of variation rules of a correlation coefficient $R_v$ of the validation set and a correlation coefficient $R_p$ of the independent test set in the prediction of TS IIA in Embodiment 2.

In the case of different numbers of samples in the calibration set, the variation rules of the root-mean-square errors and the variation rules of the corresponding correlation coefficients of the validation set and the independent test set are shown in FIG. 8 and FIG. 9 respectively. It can be seen from FIG. 8 that the variation rules of the root-mean-square errors have the consistent trend. It can be seen from FIG. 9 that the correlation coefficients also change consistently. Although the variation amplitudes are different, the variation trend is the same, and therefore the validation set may represent the independent test set to describe the prediction ability of the models.

As a contrast, the 117 samples are divided respectively through a Kennard-Stone (KS) method and an SPXY method, the same independent test set is selected, the number of the samples in the validation set is the same as that in the method of the present invention, the remaining samples are used as the calibration set, and the validation set is also used to optimize the calibration set. Relevant results are shown in Table 5.

TABLE 5

Comparison of prediction ability of models established by various data set dividing methods (averagely repeated for 10 times)

| Dividing methods | TS IIA | | CTS | | TS I | | SAB | |
|---|---|---|---|---|---|---|---|---|
| | $R_p$ | RMSEP | $R_p$ | RMSEP | $R_p$ | RMSEP | $R_p$ | RMSEP |
| KS | 0.97275 | 0.01511 | 0.95784 | 0.02404 | 0.96987 | 0.00514 | 0.96318 | 0.55303 |
| SPXY | 0.97327 | 0.01506 | 0.95649 | 0.02454 | 0.96677 | 0.00533 | 0.96337 | 0.55203 |
| Present method | 0.97815 | 0.01397 | 0.96336 | 0.02292 | 0.97641 | 0.00484 | 0.96753 | 0.53702 |

It can be seen from Table 5 that the $R_p$ values and the RMSEP of the present method are both better than those of the KS method and the SPXY method, $R_p$ of all the components is the maximum value in the three methods, while the RMSEP is the minimum in the three methods. Since the three methods use the same independent test set, $R_p$ obtained by the present method is the maximum, and the RMSEP is the minimum, which indicates that the calibration set model obtained through division of the present method has the strongest prediction ability to the same independent test set. By analysis in combination with Table 4, since the number of the samples in the calibration set is optimized in the present invention, compared with the KS method and the SPXY method (all remaining samples (about 87) except the validation set and the independent test set are used as the samples in the calibration set), the number of the samples adopted by the present invention is smaller, and the performance and prediction ability of the models are better.

Ranges of reference values of the four components in the calibration set, the validation set and the independent test set divided in various methods are listed in Table 6. The ranges are average values of results of 10 tests.

TABLE 6

Ranges of reference values (% m/m) of data sets

| | | | Independent test set | KS method | | SPXY method | | Present method | |
|---|---|---|---|---|---|---|---|---|---|
| | | | | Calibration set | Validation set | Calibration set | Validation set | Calibration set | Validation set |
| TS IIA | Minimum value | | 0.0982 | 0.0906 | 0.0934 | 0.0909 | 0.0909 | 0.0914 | 0.1000 |
| | Maximum value | | 0.2518 | 0.2549 | 0.2432 | 0.2551 | 0.2428 | 0.2547 | 0.2534 |
| CTS | Minimum value | | 0.0461 | 0.0439 | 0.0450 | 0.0447 | 0.0447 | 0.0445 | 0.0456 |
| | Maximum value | | 0.2452 | 0.2580 | 0.2507 | 0.2560 | 0.2478 | 0.2542 | 0.2491 |
| TS I | Minimum value | | 0.0157 | 0.0150 | 0.0148 | 0.0148 | 0.0148 | 0.0151 | 0.0151 |
| | Maximum value | | 0.0723 | 0.0763 | 0.0741 | 0.0763 | 0.0655 | 0.0761 | 0.0724 |
| SAB | Minimum value | | 2.4194 | 2.0361 | 2.1521 | 2.0361 | 2.0361 | 2.0483 | 2.4578 |
| | Maximum value | | 8.1693 | 8.7074 | 8.3585 | 8.7410 | 7.1341 | 8.7153 | 8.0935 |

It can be seen from Table 6 that except the tanshinone I in the KS method, the samples in the calibration sets of the other methods can cover the reference value ranges of the samples in the validation sets, and the samples in the calibration sets can also cover the samples in the independent test sets.

in parallel, and the same number of samples are randomly selected as the independent test set to calculate average values of the above indexes for comparison. Relevant results are shown in Table 7.

TABLE 7

List of prediction results of components of corn

| Components | $R_c$ | RMSEC | $R_v$ | RMSEV | $R_p$ | RMSEP | RPD | Lv | $N_c$ | $N_v$ |
|---|---|---|---|---|---|---|---|---|---|---|
| Water | 0.9994 | 0.0129 | 0.9991 | 0.0147 | 0.9978 | 0.0198 | 26.7 | 9.9 | 41.6 | 17.2 |
| Oil | 0.9592 | 0.0467 | 0.9490 | 0.0566 | 0.9384 | 0.0622 | 3.1 | 8.9 | 38.8 | 16.7 |
| Protein | 0.9851 | 0.0871 | 0.9696 | 0.1034 | 0.9717 | 0.1140 | 5.3 | 9.8 | 43.0 | 16.6 |
| Starch | 0.9725 | 0.1927 | 0.9656 | 0.2084 | 0.9496 | 0.2490 | 4.2 | 9.2 | 38.9 | 16.7 |

Embodiment 3

Taking disclosed corn data as an example, 80 samples are measured in total. X is an NIR spectral matrix of the samples, and Y is a matrix of four quality index components. Water is taken as an object for description, and the same steps are adopted for the other components. Abnormal samples are removed firstly, through a Hotelling $T^2$ method, 3 abnormal samples are detected, 77 samples are left after removal, and 10 samples are randomly selected as an independent test set $X_t$.

The remaining 67 samples are divided. The number of samples in a validation set is changed to inspect the impact of various dividing methods on model performance after the number of the samples in the validation set is changed. 2 (i.e., g=2) samples with the nearest Euclidean distance are selected for each sample in the independent test set to be selected into the validation set, the number of the samples in the validation set is about 14-20, and other samples are used to optimize the number of samples in a calibration set. PLS models are established between the matrix X and the matrix Y, and all parameters are calculated, including a root-mean-square error of calibration (RMSEC) of the calibration set, a root-mean-square error of validation (RMSEV) of the validation set, a root-mean-square error of prediction (RMSEP) of the independent test set and corresponding correlation coefficients, namely the correlation coefficient ($R_c$) of the calibration set, the correlation coefficient ($R_v$) of the validation set and the correlation coefficient ($R_p$) of an independent test set. Since the independent test set contains a certain number of randomly selected samples, there is a certain contingency. In order to objectively evaluate the dividing methods of various data sets, 10 tests are repeated It can be seen from Table 7 that the components of the corn still have a good modeling effect. The number of the samples in the calibration set is optimized to be about 40 (see Table 7), the correlation coefficients of the calibration set and the validation set of most components reach 0.95 or above, and the RPD values of all the components are greater than 3.0, which indicates good prediction ability of the models. It is indicated that the method may be used to divide sample sets and has the good model performance and prediction effect.

Figure 10:
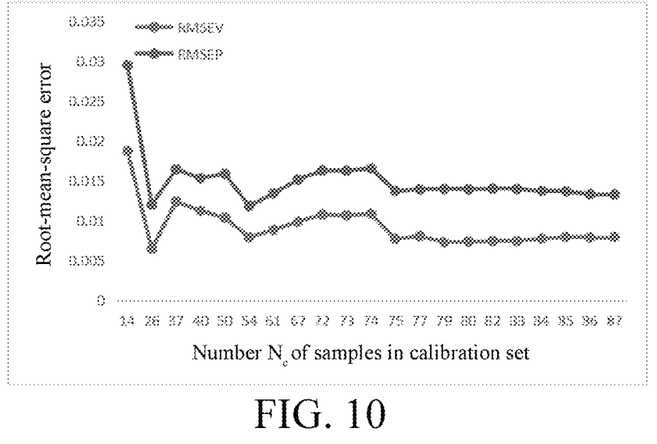
FIG. 10 is a diagram of variation rules of an RMSEV of a validation set and an RMSEP of an independent test set in the prediction of moisture in Embodiment 3.
Figure 11:
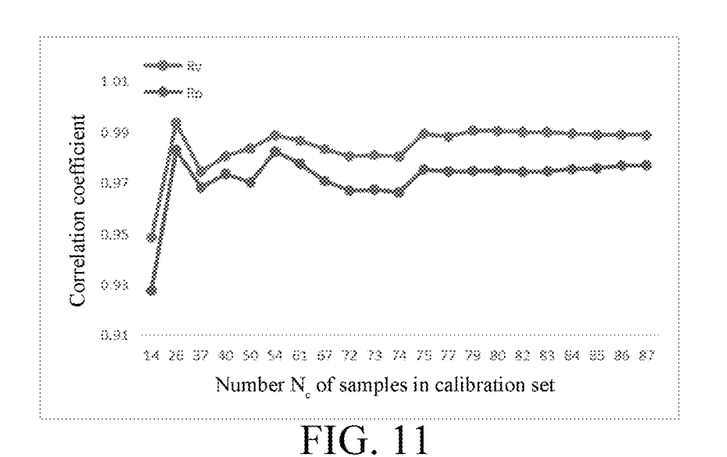
FIG. 11 is a diagram of variation rules of a correlation coefficient $R_v$ of the validation set and a correlation coefficient $R_p$ of the independent test set in the prediction of moisture in Embodiment 3.

In the process of optimizing the number of the samples in the calibration set, the root-mean-square errors of the validation set and the independent test set present a consistent variation trend, and the correlation coefficients also have the consistent variation trend, so that the samples in the validation set may be used as a reflection of prediction errors to unknown samples, and the models are made to have the better prediction ability to the unknown samples. Specific results are shown in FIG. 10 and FIG. 11.

As a contrast, the 67 samples are divided respectively through a Kennard-Stone (KS) method and an SPXY method. For comparison, samples in the independent test set are the same as those in the present method, the number of the samples in the validation set is the same as that in the present method, the remaining samples are used as the calibration set, and the samples in the validation set are also used to optimize a calibration model. Relevant results are shown in Table 8.

TABLE 8

Comparison of prediction ability of models established by various data set dividing methods (averagely repeated for 10 times)

| Dividing methods | Water | | Oil | | Protein | | Starch | |
|---|---|---|---|---|---|---|---|---|
| | $R_p$ | RMSEP | $R_p$ | RMSEP | $R_p$ | RMSEP | $R_p$ | RMSEP |
| KS | 0.9974 | 0.0226 | 0.9192 | 0.0710 | 0.9619 | 0.1359 | 0.9396 | 0.2812 |
| SPXY | 0.9977 | 0.0213 | 0.9272 | 0.0716 | 0.9651 | 0.1341 | 0.9505 | 0.2505 |
| Present method | 0.9978 | 0.0198 | 0.9384 | 0.0622 | 0.9718 | 0.1140 | 0.9496 | 0.2490 |

It can be seen from Table 8 that for oil and protein, the method proposed by the present invention is better than the KS method and the SPXY method, the RMSEP value is the minimum, and the $R_p$ value is the maximum. For water, since the modeling effect of water itself is good, the increasing space is small, the RMSEP value is still the minimum, and the $R_p$ value is still the maximum. For starch, from the perspective of $R_p$, the present method is better than the KS method and slightly poorer than the SPXY method but with small difference, while the present method has the minimum RMSEP value and the smallest prediction error. Compared with Embodiment 1, the effect of selecting the 2 nearest samples for the independent test set is slightly poorer, and this may be because the samples in the validation set include repeated and useless information or the similarity of the selected samples is lowered, which has certain interference on modeling.

Ranges of reference values of the four components in the calibration set, the validation set and the independent test set divided in the various methods are listed in Table 9. The ranges are average values of results of 10 tests.

validation set, the number of the samples in the validation set is about 20-30, and other samples are used to optimize of the number of samples in a calibration set. PLS models are established between the matrix X and the matrix Y, and all parameters are calculated, including a root-mean-square error of calibration (RMSEC) of the calibration set, a root-mean-square error of validation (RMSEV) of the validation set, a root-mean-square error of prediction (RMSEP) of the independent test set and corresponding correlation

TABLE 9

Ranges of reference values of data sets

| | | | KS method | | SPXY method | | Present method | |
|---|---|---|---|---|---|---|---|---|
| | | Independent test set | Calibration set | Validation set | Calibration set | Validation set | Calibration set | Validation set |
| Water | Minimum value | 9.7842 | 9.3800 | 9.7056 | 9.4034 | 9.4034 | 9.3876 | 9.6436 |
| | Maximum value | 10.813 | 10.977 | 10.876 | 10.991 | 10.904 | 10.970 | 10.873 |
| Oil | Minimum value | 3.2662 | 3.1180 | 3.1613 | 3.0955 | 3.0955 | 3.1154 | 3.2049 |
| | Maximum value | 3.7574 | 3.8280 | 3.7938 | 3.8242 | 3.8114 | 3.8064 | 3.7846 |
| Protein | Minimum value | 7.9885 | 7.7742 | 7.8456 | 7.6989 | 7.6989 | 7.6913 | 7.9968 |
| | Maximum value | 9.5302 | 9.6735 | 9.4910 | 9.6725 | 9.2466 | 9.6909 | 9.4927 |
| Starch | Minimum value | 63.252 | 62.838 | 63.345 | 62.843 | 62.843 | 62.877 | 63.212 |
| | Maximum value | 65.631 | 66.472 | 65.878 | 66.358 | 65.812 | 66.358 | 65.858 |

It can be seen from Table 9 that the ranges of the reference values of the samples in the calibration sets of the various methods for all the components can cover the validation sets and the independent test sets.

Embodiment 4

Taking the medicinal material radix salviae miltiorrhizae as an example, 120 samples are measured in total, including sample duplication. X is an NIR spectral matrix of the samples, and Y is a matrix of four quality index components. Tanshinone IIA (TS IIA) is taken as an example to illustrate methods, and the same steps are adopted for components such as cryptotanshinone (CTS), tanshinone I (TS I) and salvianolic acid B (SAB). Abnormal samples are removed firstly, through a Hotelling $T^2$ method, 3 abnormal samples are detected, and 117 samples are left after removal. 15 samples are randomly selected as an independent test set $X_t$.

The remaining 102 samples are divided. The number of samples in a validation set is changed to inspect the impact of various dividing methods on model performance after the number of the samples in the validation set is changed. 2 samples with the nearest Euclidean distance are selected for each sample in the independent test set to be listed in the coefficients, such as the correlation coefficient ($R_c$) of the calibration set, the correlation coefficient ($R_v$) of the validation set and the correlation coefficient ($R_p$) of a prediction set. Since the independent test set contains a certain number of randomly selected samples, there is a certain contingency. In order to objectively evaluate the dividing methods of various data sets, 10 tests are repeated in parallel, and the same number of samples are randomly selected as the independent test set to calculate average values of the above indexes for comparison. Relevant results are shown in Table 10.

TABLE 10

List of prediction results of components of radix *salviae miltiorrhizae*

| Components | $R_c$ | RMSEC | $R_v$ | RMSEV | $R_p$ | RMSEP | RPD | Lv | $N_c$ | $N_v$ |
|---|---|---|---|---|---|---|---|---|---|---|
| TS IIA | 0.9867 | 0.0085 | 0.9871 | 0.0093 | 0.9869 | 0.0119 | 6.0 | 9.8 | 60.7 | 25.9 |
| CTS | 0.9812 | 0.0124 | 0.9579 | 0.0174 | 0.9519 | 0.0221 | 3.8 | 10 | 58.5 | 25 |
| TS I | 0.9843 | 0.0033 | 0.9782 | 0.0042 | 0.9745 | 0.0061 | 4.7 | 9.8 | 65.5 | 24.5 |
| SAB | 0.9778 | 0.3592 | 0.9734 | 0.4403 | 0.9738 | 0.5478 | 4.1 | 9.7 | 58.2 | 25.7 |

It can be seen from Table 10 that the components of the medicinal material radix salviae miltiorrhizae still have a good modeling effect. The number of the samples in the calibration set is optimized to be about 60 (see Table 10), the correlation coefficients of the calibration set, the validation set and the independent test set of all the components can reach 0.95 or above, the root-mean-square error of prediction (RMSEP) of the independent test set is small, and the RPD values are all obviously greater than 3.0, which indicates good modeling performance and prediction ability of the models.

Figure 12:
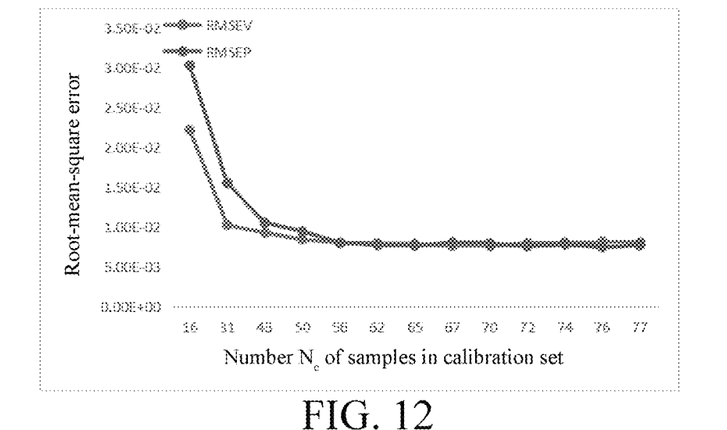
FIG. 12 is a diagram of variation rules of an RMSEV of a validation set and an RMSEP of an independent test set in the prediction of TS IIA in Embodiment 4.
Figure 13:
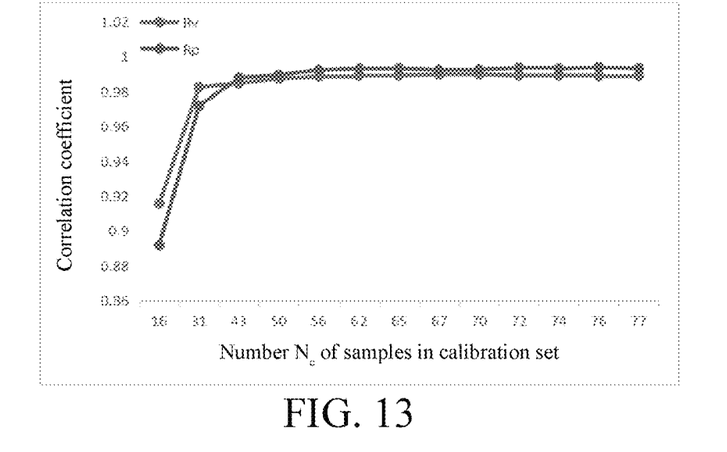
FIG. 13 is a diagram of variation rules of a correlation coefficient $R_v$ of the validation set and a correlation coefficient $R_p$ of the independent test set in the prediction of TS IIA in Embodiment 4.

In the process of optimizing the number of the samples in the calibration set, the root-mean-square errors of the validation set and the independent test set present a consistent variation trend, the correlation coefficients also have the consistent variation trend, and the variation trend of the correlation coefficients and the variation trend of the root-mean-square errors are opposite, so that the samples in the validation set may be used as a reflection of prediction errors to unknown samples, and therefore the models can be better optimized, and the unknown samples can be predicted in a more targeted manner. Specific results are shown in FIG. 12 and FIG. 13.

As a contrast, the 102 samples are divided respectively by Kennard-Stone (KS) method and SPXY method. For comparison, samples in the independent test set are the same as those in the present method, the number of the samples in the validation set is the same as that in the present method, the remaining samples are used as the calibration set, and the samples in the validation set are used to optimize a calibration model. Relevant results are shown in Table 11.

TABLE 11

Comparison of prediction ability of models established by various data set dividing methods (averagely repeated for 10 times)

| Dividing methods | TS IIA | | CTS | | TS I | | SAB | |
| --- | --- | --- | --- | --- | --- | --- | --- | --- |
| | $R_p$ | RMSEP | $R_p$ | RMSEP | $R_p$ | RMSEP | $R_p$ | RMSEP |
| KS | 0.9847 | 0.0123 | 0.9486 | 0.0225 | 0.9727 | 0.0061 | 0.9712 | 0.5406 |
| SPXY | 0.9808 | 0.0135 | 0.9436 | 0.0236 | 0.9715 | 0.00615 | 0.9730 | 0.5315 |
| Present method | 0.9869 | 0.0119 | 0.9520 | 0.0221 | 0.9745 | 0.00613 | 0.9738 | 0.5478 |

It can be seen from Table 11 that the modeling effect and prediction ability of the present invention to most components are slightly improved, except that the $R_p$ value of the CTS is improved more, the $R_p$ values of the rest of the components have little difference, and although the improvement amplitude is small, the present method is still the best among the three methods. The RMSEP value of the SAB is slightly poorer, but the $R_p$ value of the SAB is still the highest. Compared with Embodiment 2, 1 additional nearest sample is selected for each sample in the independent test set, and the modeling effect is poorer than the situation in Embodiment 2, this may be because the sample includes repeated and useless information or the similarity of the selected sample is lowered.

Ranges of reference values of the four components in the calibration set, the validation set and the independent test set divided in the various methods are listed in Table 12. The ranges are average values of results of 10 tests.

TABLE 12

Ranges of reference values (% m/m) of data sets

| | | | KS method | | SPXY method | | Present method | |
| --- | --- | --- | --- | --- | --- | --- | --- | --- |
| | | Independent test set | Calibration set | Validation set | Calibration set | Validation set | Calibration set | Validation set |
| TS IIA | Minimum value | 0.0949 | 0.0870 | 0.0900 | 0.0875 | 0.0875 | 0.0892 | 0.0913 |
| | Maximum value | 0.2511 | 0.2553 | 0.2514 | 0.2551 | 0.2503 | 0.2522 | 0.2543 |
| CTS | Minimum value | 0.0513 | 0.0439 | 0.0440 | 0.0448 | 0.0448 | 0.0437 | 0.0535 |
| | Maximum value | 0.2486 | 0.2574 | 0.2520 | 0.2561 | 0.2508 | 0.2537 | 0.2541 |
| TS I | Minimum value | 0.0150 | 0.0139 | 0.0144 | 0.0138 | 0.0138 | 0.0143 | 0.0146 |
| | Maximum value | 0.0771 | 0.0775 | 0.0772 | 0.0777 | 0.0737 | 0.0773 | 0.0773 |
| SAB | Minimum value | 2.1387 | 2.0418 | 2.1278 | 2.0402 | 2.0402 | 2.0395 | 2.1278 |
| | Maximum value | 8.4122 | 8.8838 | 8.7582 | 8.8934 | 8.6577 | 8.7576 | 8.5865 |

In can be seen from Table 12 that although the range of the validation set in the sample sets selected for the cryptotanshinone in the present method slightly exceeds the range of the calibration set, in practice, unknown samples may not be necessarily contained in the range of the calibration set, and therefore the applicability of the present method may be better. The ranges of the reference values of the samples in the calibration sets of the various methods for the rest of the components can cover the validation sets and the independent test sets.

The foregoing one or more embodiments have the following technical effects:

According to the calibration set and validation set dividing method of the present invention, starting from validation data (i.e., the independent test set, which is used to test the model performance as unknown samples after a model is established) used to test the model performance, spectra similar to the independent test set are selected as the validation set based on the independent test set and the spectral similarity, the prediction ability to the unknown samples is indirectly reflected by the prediction effect of the validation set; and then, based on the validation set, spectra similar to the validation set are selected as the calibration set, so that it is ensured that the established model aims at the unknown samples, and compared with the current commonly used methods, it can be exactly proved that for the unknown samples, the modeling performance of the proposed method is better and the prediction ability is stronger.

Selection of the validation set and the calibration set further relates to selection of the sample number, and the number of the samples in the calibration set is optimized in the present invention, so that selecting few samples can achieve the better prediction effect.

A person skilled in the art should understand that the modules or steps in the present invention may be implemented by using a general-purpose computer apparatus. Optionally, they may be implemented by using program code executable by a computing apparatus, so that they may be stored in a storage apparatus and executed by the computing apparatus. Alternatively, the modules or steps are respectively manufactured into various integrated circuit modules, or a plurality of modules or steps thereof are manufactured into a single integrated circuit module. The present invention is not limited to any specific combination of hardware and software.

The foregoing descriptions are merely preferred embodiments of the present invention, but are not intended to limit the present invention. A person skilled in the art may make various alterations and variations to the present invention. Any modification, equivalent replacement, or improvement made and the like within the spirit and principle of the present invention shall fall within the protection scope of the present invention.

The specific implementations of the present invention are described above with reference to the accompanying drawings, but are not intended to limit the protection scope of the present invention. Those skilled in the art should understand that various modifications or deformations may be made without creative efforts based on the technical solutions of the present invention, and such modifications or deformations shall fall within the protection scope of the present invention.

What is claimed is:

1. A method for selection of a calibration set and a validation set based on spectral similarity, comprising the following steps:

performing near infrared (NIR) spectrometry on original samples using NIR spectrometry equipment to obtain a spectral matrix of the original samples;

measuring reference values of the original samples to obtain a reference value matrix of the original samples;

detecting abnormal values in the spectral matrix of the original samples using an algorithm, removing the abnormal spectra, and correspondingly removing the reference values in the reference value matrix of the original samples;

randomly selecting m samples as an independent test set to simulate testing of unknown samples;

calculating, using a computer program, spectral similarity between each of the samples in the independent test set and each of the remaining samples in the original samples respectively to obtain g samples having the highest similarity to be written into the validation set; and calculating, using a computer program, spectral similarity between each of the samples in the validation set and each of the remaining samples in the original samples to obtain n samples having the highest similarity to be written into the calibration set; wherein the number of the original samples after removal of the abnormal values is set to be N, and a relation of m, g and n meets: $g \leq n \leq (N-m)$, generating a predictive model based on the calibration set and the validation set, and verifying the performance in (i) quality inspection of agricultural products or (ii) component analysis of traditional Chinese medicines.

2. The method for selection of the calibration set and the validation set based on the spectral similarity according to claim 1, wherein the spectral similarity between the samples is calculated by adopting a Euclidean distance.

3. A modeling method based on the method for selection of the calibration set and the validation set according to claim 2, wherein a reference value matrix corresponding to the calibration set is obtained, and each column of reference values in the reference value matrix is subjected to a construction of relation modeling with a spectral matrix, respectively.

4. The modeling method according to claim 3, wherein the method further comprises:

optimizing model parameters based on the validation set; and evaluating model performance based on an independent test set.

5. The modeling method according to claim 3, wherein the method further comprises comprehensively evaluating model performance based on the calibration set, the validation set and an independent test set.

6. The method for selection of the calibration set and the validation set based on the spectral similarity according to claim 1, wherein modeling is performed respectively when n has different values, and the value of n is optimized based on model performance to obtain an optimized model parameter value.

7. A modeling method based on the method for selection of the calibration set and the validation set according to claim 6, wherein a reference value matrix corresponding to the calibration set is obtained, and each column of reference values in the reference value matrix is subjected to a construction of relation modeling with a spectral matrix, respectively.

8. The modeling method according to claim 7, wherein the method further comprises:
optimizing model parameters based on the validation set; and
evaluating model performance based on an independent test set.

9. The modeling method according to claim 7, wherein the method further comprises comprehensively evaluating model performance based on the calibration set, the validation set and an independent test set.

10. A modeling method based on the method for selection of the calibration set and the validation set according to claim 1, wherein a reference value matrix corresponding to the calibration set is obtained, and each column of reference values in the reference value matrix is subjected to a construction of relation modeling with a spectral matrix, respectively.

11. The modeling method according to claim 10, wherein the method further comprises:
optimizing model parameters based on the validation set; and
evaluating model performance based on an independent test set.

12. The modeling method according to claim 10, wherein the method further comprises comprehensively evaluating model performance based on the calibration set, the validation set and an independent test set.

13. A modeling method based on the method for selection of the calibration set and the validation set according to claim 1, wherein a reference value matrix corresponding to the calibration set is obtained, and each column of reference values in the reference value matrix is subjected to a construction of relation modeling with a spectral matrix, respectively.

14. The modeling method according to claim 13, wherein the method further comprises:
optimizing model parameters based on the validation set; and
evaluating model performance based on an independent test set.

15. The modeling method according to claim 13, wherein the method further comprises comprehensively evaluating model performance based on the calibration set, the validation set and an independent test set.

16. A modeling method based on the method for selection of the calibration set and the validation set according to claim 1, wherein a reference value matrix corresponding to the calibration set is obtained, and each column of reference values in the reference value matrix is subjected to a construction of relation modeling with a spectral matrix, respectively.

17. The modeling method according to claim 16, wherein the method further comprises:
optimizing model parameters based on the validation set; and
evaluating model performance based on an independent test set.

18. The modeling method according to claim 16, wherein the method further comprises comprehensively evaluating model performance based on the calibration set, the validation set and an independent test set.

* * * * *